US009543500B2

(12) United States Patent
Osada et al.

(10) Patent No.: US 9,543,500 B2
(45) Date of Patent: Jan. 10, 2017

(54) FERROELECTRIC THIN FILM HAVING SUPERLATTICE STRUCTURE, MANUFACTURING METHOD THEREOF, FERROELECTRIC ELEMENT, AND MANUFACTURING METHOD THEREOF

(75) Inventors: Minoru Osada, Ibaraki (JP); Takayoshi Sasaki, Ibaraki (JP)

(73) Assignee: NATIONAL INSTITUTE FOR MATERIALS SCIENCE, Ibaraki (JP)

( * ) Notice: Subject to any disclaimer, the term of this patent is extended or adjusted under 35 U.S.C. 154(b) by 700 days.

(21) Appl. No.: 13/878,571

(22) PCT Filed: Oct. 4, 2011

(86) PCT No.: PCT/JP2011/072844
§ 371 (c)(1),
(2), (4) Date: May 22, 2013

(87) PCT Pub. No.: WO2012/050007
PCT Pub. Date: Apr. 19, 2012

(65) Prior Publication Data
US 2013/0244016 A1 Sep. 19, 2013

(30) Foreign Application Priority Data

Oct. 13, 2010 (JP) ................. 2010-230132

(51) Int. Cl.
*B32B 7/02* (2006.01)
*B32B 27/32* (2006.01)
(Continued)

(52) U.S. Cl.
CPC .......... *H01L 41/183* (2013.01); *C30B 19/062* (2013.01); *G11C 11/22* (2013.01); *H01G 4/12* (2013.01);
(Continued)

(58) Field of Classification Search
None
See application file for complete search history.

(56) References Cited

U.S. PATENT DOCUMENTS 5,423,285 A * 6/1995 Paz de Araujo ......... B05D 1/00
117/88
2010/0226067 A1* 9/2010 Osada et al. ............... 361/311

FOREIGN PATENT DOCUMENTS

JP 2001-270022 * 10/2001 ............ B23B 9/00
JP 2004-023042 1/2004
(Continued)

OTHER PUBLICATIONS

B. Li et al., "Ferroelectric Properties of Perovskite Nanosheet Superlattices", 28th The meeting on Ferroelectric Materials and Their Applications, published on May 27, 2011.
(Continued)

*Primary Examiner* — David Sample
*Assistant Examiner* — Nicole T Gugliotta
(74) *Attorney, Agent, or Firm* — Wenderoth, Lind & Ponack, L.L.P.

(57) ABSTRACT

At least two types of dielectric materials such as oxide nanosheets having a layered perovskite structure that differ from each other are laminated, and the nanosheets are bonded to each other via an ionic material, thereby producing a superlattice structure-having ferroelectric thin film. Having the layered structure, the film can exhibit ferroelectricity as a whole, though not using a ferroelectric material therein. Accordingly, there is provided a ferroelectric film based on a novel principle, which is favorable for ferroelectric memories and others and which is free from a size effect even though extremely thinned.

14 Claims, 3 Drawing Sheets

(51) Int. Cl.
| | |
|---|---|
| *H01L 29/04* | (2006.01) |
| *H01L 41/18* | (2006.01) |
| *G11C 11/22* | (2006.01) |
| *H01L 21/02* | (2006.01) |
| *H01L 27/115* | (2006.01) |
| *C30B 19/06* | (2006.01) |
| *H01G 4/12* | (2006.01) |
| *H01L 41/187* | (2006.01) |
| *H01G 4/33* | (2006.01) |
| *H01L 41/317* | (2013.01) |
| *H01L 49/02* | (2006.01) |

(52) U.S. Cl.
CPC .......... *H01G 4/33* (2013.01); *H01L 21/02197* (2013.01); *H01L 27/11507* (2013.01); *H01L 41/1871* (2013.01); *H01L 41/1873* (2013.01); *H01L 41/1876* (2013.01); *H01L 41/1878* (2013.01); *H01L 41/317* (2013.01); *H01L 28/55* (2013.01); *Y10T 428/24975* (2015.01)

(56) References Cited

FOREIGN PATENT DOCUMENTS

| | | |
|---|---|---|
| JP | 2004-255684 | 9/2004 |
| WO | 2008/078652 | 7/2008 |

OTHER PUBLICATIONS

B. Li et al., "Solution-Based Fabrication of Perovskite Multilayers and Superlattices Using Nanosheet Process", Japanese Journal of Applied Physics, vol. 50, Sep. 20, 2011, pp. 09NA-10-1 to 09NA-10-6.

K. Akatsuka et al., "Construction of Highly Ordered Lamellar Nanostructures through Langmuir-Blodgett Deposition of Molecularly Thin Titania Nanosheets Tens of Micrometers Wide and Their Excellent Dielectric Properties", ACS Nano, vol. 3, No. 5, pp. 1097-1106, 2009.

International Search Report issued Nov. 8, 2011 in International (PCT) Application No. PCT/JP2011/072844.

\* cited by examiner

FERROELECTRIC THIN FILM HAVING SUPERLATTICE STRUCTURE, MANUFACTURING METHOD THEREOF, FERROELECTRIC ELEMENT, AND MANUFACTURING METHOD THEREOF

TECHNICAL FIELD

The present invention relates to a ferroelectric thin film that functions as a non-volatile ferroelectric memory and is favorable for application to a broad field of electronic information appliances such as portable telephones, mobile electronic appliances and others, and to a method for producing the ferroelectric thin film, as well as to a ferroelectric element using the ferroelectric thin film and to a method for producing the ferroelectric element.

BACKGROUND ART

A ferroelectric material is a type of dielectric materials and is a material which spontaneously polarizes even in the absence of any external electric field (with electric dipoles kept aligned) and of which the polarization direction varies depending on the electric field therearound. Typical materials of the type include barium titanate $BaTiO_3$, lead titanate $PbTiO_3$, lead zirconate titanate $Pb(Zr,Ti)O_3$ and the like having a perovskite structure, which are applied to ferroelectric memories, actuators and others using the spontaneous polarization characteristics and the piezoelectric characteristics that the ferroelectric material has.

In a ferroelectric material, it is known that a larger amount of displacement of each constituent element from the normal position provides more excellent ferroelectric characteristics (spontaneous polarization, etc.).

Accordingly, for obtaining excellent ferroelectric characteristics, it is preferable to attain artificial lattice displacement. For this, various studies and developments of producing a ferroelectric thin film by the use of a substrate that differs from the ferroelectric material in point of the lattice constant thereof to thereby induce artificial stress and improve spontaneous polarization through the lattice mismatch between the ferroelectric material and the substrate have been actively tried, and the results have been reported. Apart from the stress effect of the substrate mentioned above, a ferroelectric superlattice can be produced by alternately layering two or more different types of ferroelectric materials that differ in the lattice constant (for example, $BaTiO_3$ and $SrTiO_3$, etc.) to thereby generate a pressure through lattice strain in the in-plane direction of the thin film surface, owing to the lattice constant difference; and according to this, studies and developments of improving spontaneous polarization have been actively tried, and the results have been reported.

However, the above-mentioned ferroelectric thin film is such that the spontaneous polarization thereof has been improved by imparting stress or lattice strain to the original ferroelectric material, and it is impossible to convert a material that is not a ferroelectric material into a ferroelectric material.

For ferroelectric memory application, preferred is use of an ultrathin film for high-speed, large-volume low-voltage operation. However, when conventional ferroelectric materials of barium titanate $BaTiO_3$, lead titanate $PbTiO_3$, lead zirconate titanate $Pb(Zr,Ti)O_3$ or the like are thinned to a thickness of 50 nm, then the spontaneous polarization and the relative dielectric constant thereof may lower and they could not function as ferroelectric materials, or that is, conventional ferroelectric materials involve such an essential problem of "size effect". Consequently, so far as conventional ferroelectric materials are used, it is difficult to provide a ferroelectric thin film having a thickness of not more than 50 nm.

PRIOR ART DOCUMENTS

Patent Documents

Patent Document 1: JP-A 2001-270022
Patent Document 2: JP-A 2004-255684

Non-Patent Document

Non-Patent Document 1: Kosho Akatsuka, Masa-aki Haga, Yasuo Ebina, Minoru Osada, Katsutoshi Fukuda, Takayoshi Sasaki, "Construction of Highly Ordered Lamellar Nanostructures through Langmuir-Blodgett Deposition of Molecularly Thin Titania Nanosheets Tens of Micrometers Wide and Their Excellent Dielectric Properties", ACS Nano, 3, 1097-1106 (2009).

SUMMARY OF INVENTION

Problems to be Solved by the Invention

An object of the invention is to solve the above-mentioned problems and to provide a ferroelectric thin film that does not express a size effect even though extremely thinned, and a method for producing the ferroelectric thin film, and to provide a ferroelectric element using the ferroelectric thin film and a method for producing the ferroelectric element.

Means for Solving the Problems

According to one aspect of the invention, there is provided a ferroelectric thin film having a superlattice structure and produced by layering at least two different types of dielectric materials, in which the different dielectric materials are bonded with an ionic material.

In this, the dielectric material may be an oxide having a perovskite structure.

The dielectric material may be an oxide having a layered perovskite structure with at least one of an $NbO_6$ octahedron, a $TaO_6$ octahedron or a $TiO_6$ octahedron enveloped in the unit lattice thereof.

The dielectric material may be a nanosheet-like oxide having a thickness of at most 5 nm and a lateral size of from 100 nm to 100 μm.

The dielectric material may be one obtained by peeling any of layered oxides represented by the following compositional formulae, or their hydrates.

Compositional formula $A_xM_yNb_2O_{7-d}$, $A_xM_yM'_2O_{7-d}$, $A_xCa_2Nb_3O_{10-d}$, $A_xCa_{2-y}M_yNb_{3-z}M'_zO_{10-d}$, $A_xM_2M'_3O_{10-d}$ or $A_x[Ca_{n-1}Na_{n-3}Nb_nO_{3n+1-d}]$ (wherein A represents at least one selected from a group of H, Li, Na, K, Rb and Cs; $0 \leq x \leq 1$; M represents at least one selected from a group of Sr, Ba, Pb, Bi, and rare earth elements La, Ce, Pr, Sm, Eu, Gd, Tb, Dy, Ho, Er, Tm, Yb and Lu; $0 \leq y \leq 1$; M' represents at least one selected from a group of Ti, Mg, Mn, Cu, Zn, Nb and Ta; $0 < z \leq 3$; n=3 to 8; d=0 to 2).

The dielectric material may be a nanosheet-like perovskite oxide represented by the following compositional formula.

Compositional formula $M_yNb_2O_{7-d}$, $M_yM'_2O_{7-d}$, $Ca_2Nb_3O_{10-d}$, $Ca_{2-y}M_yNb_{3-z}M'_zO_{10-d}$, $M_2M'_3O_{10-d}$ or $[Ca_{n-1}Na_{n-3}Nb_nO_{3n+1-d}]$ (wherein M represents at least one selected from a group of Sr, Ba, Pb, Bi and rare earth elements La, Ce, Pr, Sm, Eu, Gd, Tb, Dy, Ho, Er, Tm, Yb and Lu; $0<y\leq1$; M' represents at least one selected from a group of Ti, Mg, Mn, Cu, Zn, Nb and Ta; $0<z\leq3$; n=3 to 8; d=0 to 2).

The thickness of the ferroelectric thin film may be from 1 nm to 50 nm.

According to another aspect of the invention, there is provided a ferroelectric element with any of the above-mentioned ferroelectric thin films adhering to an electrode substrate.

According to still another aspect of the invention, there is provided a method for producing a ferroelectric element, which includes adhering any of the above-mentioned ferroelectric thin films onto a first electrode substrate and arranging a second electrode on the side of the ferroelectric thin film opposite to the side thereof having the first electrode substrate adhering thereto.

The ferroelectric thin film having a superlattice structure may be produced by repeating a step of densely and tightly coating the surface of the first electrode substrate with the dielectric material according to a Langmuir-Blodgett method to form a monolayer film on the surface, thereby adhering the monolayer film to the first electrode substrate.

The ferroelectric thin film may be produced by immersing the first electrode substrate in a cationic organic polymer solution to thereby make the organic polymer adsorbed by the surface of the first electrode substrate or by the surface of the dielectric material already adsorbed by the first electrode substrate, and then further immersing it in a colloid solution with the dielectric material suspended therein so as to make the dielectric material adsorbed by the surface of the dielectric material through electrostatic interaction therebetween, thereby producing the ferroelectric thin film having a superlattice structure.

In the step of making the dielectric material adsorbed by the first substrate through electrostatic interaction therebetween, ultrasonic wave may be imparted to the system to thereby remove the overlapping part of the dielectric materials.

After formed, the ferroelectric thin film having a superlattice structure may be irradiated with UV light to remove the organic polymer.

The ionic material may be formed from the organic polymer through irradiation with UV light.

The ferroelectric thin film may be formed by peeling the layered material with a peeling agent, and after formed, the ferroelectric thin film may be irradiated with UV light to remove the peeling agent, and the ionic material may be formed from the peeling agent through irradiation with UV light.

Effects of the Invention

According to the invention, even dielectric materials which heretofore could not be used as ferroelectric materials, can be softly bonded to each other with an ionic material in such a manner that the ion can readily move, depending on their combination, whereby it has become possible to realize stable ferroelectricity and to produce a ferroelectric thin film; and consequently, the invention has made it possible to greatly broaden the application range of dielectric materials and to greatly broaden the latitude in selecting ferroelectric materials.

Further, the invention has made it possible to utilize individual high-dielectric characteristics and high structure controllability that a perovskite-structured oxide has, and has made it possible to realize both ferroelectric characteristics and high-dielectric characteristics.

Further, the invention has made it possible to utilize individual high-dielectric characteristics and high structure controllability that a layered perovskite structure has while having at least one of an $NbO_6$ octahedron, a $TaO_6$ octahedron or a $TiO_6$ octahedron enveloped in the unit lattice thereof, and has made it possible to realize both excellent ferroelectric characteristics and high-dielectric characteristics.

Further, using an ultra-thin nanosheet-like oxide having a thickness of at most 5 nm, the invention has made it possible to produce and design a nano-level ferroelectric thin film.

Further, it has become possible to extract a simple material of a perovskite oxide having at least one of an $NbO_6$ octahedron, a $TaO_6$ octahedron or a $TiO_6$ octahedron enveloped as a basic block therein and known as a high-dielectric material, as a nanosheet and to artificially reconstruct it, and therefore, the invention has made it possible to produce and plan a ferroelectric thin film having a higher dielectric constant than any conventional perovskite as a nano-level thin film.

Further, the invention has made it possible to utilize the high electronic polarization characteristics and large surface strain that a nanosheet-like perovskite oxide has while having an $NbO_6$ octahedron, a $TaO_6$ octahedron or a $TiO_6$ octahedron enveloped therein, and therefore has made it possible to realize both ferroelectric characteristics and high-dielectric characteristics stable at room temperature.

Further, the invention provides a ferroelectric thin film capable of functioning even though having a nano-scale thickness of at most 50 nm, and therefore the invention attains both film thinning and capacity increase which conventional ferroelectric thin films could never attain at all.

In addition, according to the invention, even a poorly self-sustainable nanosheet-like perovskite oxide has become readily handleable by holding it on an electrode substrate, and the invention has made it possible to secure good productivity of elements using the ferroelectric thin film of the invention.

Further, the invention provides a capacitor structure element using the ferroelectric thin film of the invention, and has made it possible to secure good productivity and stability of ferroelectric elements.

According to the Langmuir-Blodgett method, it has become possible to produce a high-quality ferroelectric thin film in which the surface of the substrate is densely and tightly coated with a nanosheet-like perovskite oxide, and therefore, the invention has made it possible to directly produce a high-performance ferroelectric element according to a low-cost room-temperature solution process in which defects to cause circuit leakage current are removed or reduced.

Further, different from a conventional ferroelectric thin film process, the invention has made it possible to employ a solution process at room temperature not requiring annealing or the like at high temperature, and therefore, the invention provides a high-performance ferroelectric element while evading problems of substrate interface degradation, composition deviation and others that occur in conventional element production steps.

Further, in the invention, a low-cost room-temperature process using a beaker and tweezers can be employed, and therefore the invention realizes a low-cost low-environmental-load process not requiring any large-scale vacuum apparatus and expensive film formation apparatus that are the mainstream of a conventional ferroelectric thin film production process.

Further, the invention has made it possible to produce a high-quality ferroelectric thin film in which the substrate surface is densely and tightly coated with a nanosheet-like perovskite oxide, and therefore, the invention provides a high-performance ferroelectric element in which defects to cause circuit leakage current are removed or reduced.

Further, the invention has made it possible to produce an organic material-free, inorganic ferroelectric element, and therefore can provide a high-performance ferroelectric element quite free from problems of substrate interface degradation, composition deviation and others that occur in the heat treatment step in a conventional element production process.

MODE FOR CARRYING OUT THE INVENTION

The present inventors have assiduously investigated the optimum structure that establishes the ferroelectricity expression mechanism in an ultrathin film that "a larger amount of displacement of each constituent element from the normal position provides more excellent ferroelectric characteristics (spontaneous polarization, etc.)", and have found a principle that even a dielectric material that could not be a ferroelectric material can show ferroelectricity when the bonding interface thereof is softly bonded with an ionic material in such a manner that the ion inside the dielectric material could be readily mobile, and further applying this finding, the inventors have attained the present invention.

The technique of "softly bonding the bonding interface of a dielectric material with an ionic material" as referred to herein means that dielectric materials are electrostatically bonded to each other via an ionic material such as a metal ion, a polyatomic ion, a complex ion, a cluster ion or the like. This quite differs from the interface state in a conventional ferroelectric superlattice (for example, $BaTiO_3$ and $SrTiO_3$, etc.). More specifically, in a conventional ferroelectric superlattice, the dielectric materials firmly bond to each other via a metal-oxygen bond so that the position of each constituent atom of the dielectric material is fixed on the left, right, top and bottom thereof, while the invention is characterized in that the dielectric materials are electrostatically bonded to each other merely on the top and bottom thereof via an ionic material therebetween, but have a soft interface with a flexible freedom on the left and right thereof.

The invention is characterized as above, and the embodiments thereof are described below.

Figure 1:
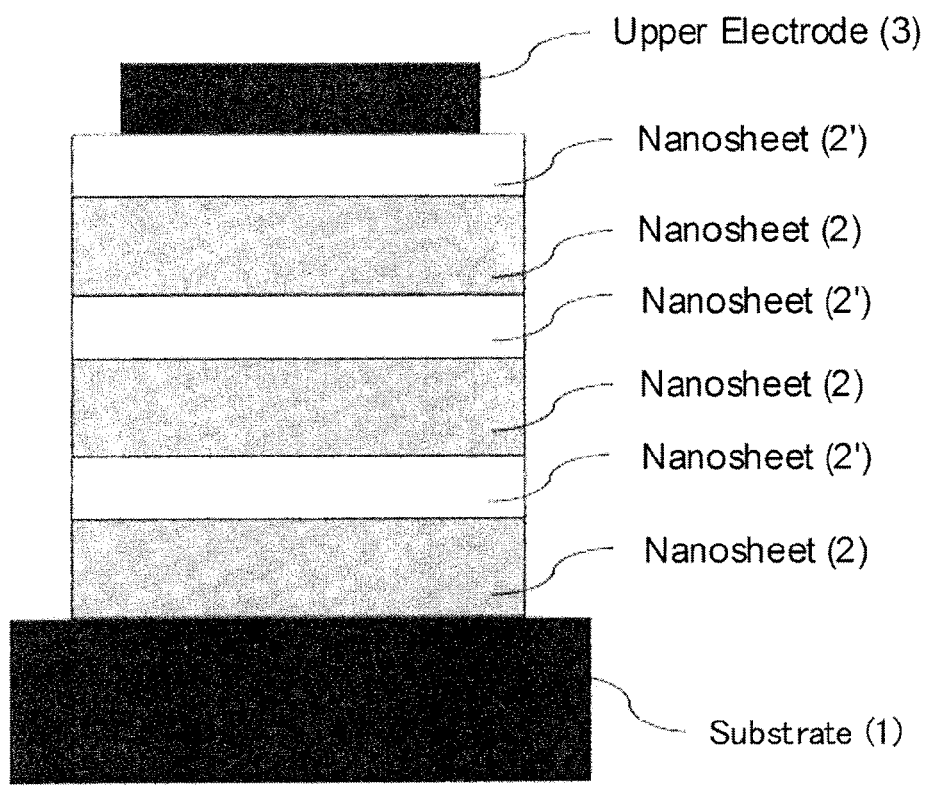
FIG. 1 is a schematic view of the configuration of a thin film element that includes a perovskite nanosheet thin film shown in Examples 1 to 4.

FIG. 1 is a view schematically showing a cross-sectional structure of a ferroelectric thin film which has a superlattice structure formed of two types of dielectric nanosheet-like perovskite oxides of one embodiment of the invention.

In FIG. 1, (1) is a lower electrode substrate formed of atomically-flat epitaxial $SrRuO_3$ (hereinafter this may be simply referred to as "substrate"), (2) and (2') are superlattice structures of two types of dielectric nanosheet-like perovskite oxides formed on the substrate (1) (hereinafter referred to as perovskite nanosheet), (3) is a upper electrode of gold. The embodiment of FIG. 1 demonstrates a case of a superlattice structure in which perovskite nanosheets (2) and (2') are alternately layered on the bottom electrode substrate (1) of $SrRuO_3$.

In the invention, the lower electrode substrate (1) is not limited to the atomically-flat epitaxial substrate, and similarly thereto, the perovskite nanosheet thin film may be arranged on the substrate of any other different type such as a metal electrode of gold, platinum, copper, aluminium or the like, or a conductive perovskite substrate of Nb-doped $SrTiO_3$ or the like, a transparent oxide electrode of ITO, Ga-doped ZnO, Nb-doped $TiO_2$ or the like, or Si, glass, plastics or the like. Like the lower electrode substrate (1), the upper electrode (3) may have any other various material and configuration.

The perovskite nanosheets (2) (for example, $Ca_2Nb_3O_{10}$) and (2') (for example, $LaNb_2O_7$) to be the constitutive layers of the ferroelectric thin film are nano-materials having a two-dimensional anisotropy, which are obtained by peeling a layered perovskite oxide through soft chemical treatment to the basic minimum unit, one layer of the crystal structure. The perovskite nanosheets (2) and (2') may be nanosheets each including a different perovskite oxide shown below, as the main ingredient thereof.

The ferroelectric element of the invention includes mainly a laminate of such dielectric perovskite nanosheets, in which, for example, the perovskite nanosheets may have a particle size of preferably a thickness of at most 5 nm (corresponding to a few atoms) and a lateral size of from 100 nm to 100 μm.

The perovskite nanosheets of the type can be obtained by peeling a layered perovskite oxide. There are known various types of layered perovskite oxides usable here. For example, preferably mentioned are the following each having a high-functional dielectric block of an $NbO_6$ octahedron, a $TaO_6$ octahedron or a $TiO_6$ octahedron enveloped therein.

Compositional formulae $H_xLaNb_{2-z}Ta_zO_7$, $Li_xLaNb_{2-z}Ta_zO_7$, $Na_xLaNb_{2-z}Ta_zO_7$, $K_xLaNb_{2-z}Ta_zO_7$, $Rb_xLaNb_{2-z}Ta_zO_7$, $Cs_xLaNb_{2-z}Ta_zO_7$, $H_xCeNb_{2-z}Ta_zO_7$, $Li_xCeNb_{2-z}Ta_zO_7$, $Na_xCeNb_{2-z}Ta_zO_7$, $K_xCeNb_{2-z}Ta_zO_7$, $Rb_xCeNb_{2-z}Ta_zO_7$, $Cs_xCeNb_{2-z}Ta_zO_7$, $H_xSmNb_{2-z}Ta_zO_7$, $Li_xSmNb_{2-z}Ta_zO_7$, $Na_xSmNb_{2-z}Ta_zO_7$, $K_xSmNb_{2-z}Ta_zO_7$, $Rb_xSmNb_{2-z}Ta_zO_7$, $Cs_xSmNb_{2-z}Ta_zO_7$, $H_xEuNb_{2-z}Ta_zO_7$, $Li_xEuNb_{2-z}Ta_zO_7$, $Na_xEuNb_{2-z}Ta_zO_7$, $K_xEuNb_{2-z}Ta_zO_7$, $Rb_xEuNb_{2-z}Ta_zO_7$, $Cs_xEuNb_{2-z}Ta_zO_7$, $H_xGdNb_{2-z}Ta_zO_7$, $Li_xGdNb_{2-z}Ta_zO_7$, $Na_xGdNb_{2-z}Ta_zO_7$, $K_xGdNb_{2-z}Ta_zO_7$, $Rb_xGdNb_{2-z}Ta_zO_7$, $Cs_xGdNb_{2-z}Ta_zO_7$, $H_xTbNb_{2-z}Ta_zO_7$, $Li_xTbNb_{2-z}Ta_zO_7$, $Na_xTbNb_{2-z}Ta_zO_7$, $K_xTbNb_{2-z}Ta_zO_7$, $Rb_xTbNb_{2-z}Ta_zO_7$, $Cs_xTbNb_{2-z}Ta_zO_7$, $H_xDyNb_{2-z}Ta_zO_7$, $Li_xDyNb_{2-z}Ta_zO_7$, $Na_xDyNb_{2-z}Ta_zO_7$, $K_xDyNb_{2-z}Ta_zO_7$, $Rb_xDyNb_{2-z}Ta_zO_7$, $Cs_xDyNb_{2-z}Ta_zO_7$, $H_xHoNb_{2-z}Ta_zO_7$, $Li_xHoNb_{2-z}Ta_zO_7$, $Na_xHoNb_{2-z}Ta_zO_7$, $K_xHoNb_{2-z}Ta_zO_7$, $Rb_xHoNb_{2-z}Ta_zO_7$, $Cs_xHoNb_{2-z}Ta_zO_7$, $H_xErNb_{2-z}Ta_zO_7$, $Li_xErNb_{2-z}Ta_zO_7$, $Na_xErNb_{2-z}Ta_zO_7$, $K_xErNb_{2-z}Ta_zO_7$, $Rb_xErNb_{2-z}Ta_zO_7$, $Cs_xErNb_{2-z}Ta_zO_7$, $H_xTmNb_{2-z}Ta_zO_7$, $Li_xTmNb_{2-z}Ta_zO_7$, $Na_xTmNb_{2-z}Ta_zO_7$, $K_xTmNb_{2-z}Ta_zO_7$, $Rb_xTmNb_{2-z}Ta_zO_7$, $Cs_xTmNb_{2-z}Ta_zO_7$, $H_xYbNb_{2-z}Ta_zO_7$, $Li_xYbNb_{2-z}Ta_zO_7$, $Na_xYbNb_{2-z}Ta_zO_7$, $K_xYbNb_{2-z}Ta_zO_7$, $Rb_xYbNb_{2-z}Ta_zO_7$, $Cs_xYbNb_{2-z}Ta_zO_7$, $H_xLuNb_{2-z}Ta_zO_7$, $Li_xLuNb_{2-z}Ta_zO_7$, $Na_xLuNb_{2-z}Ta_zO_7$, $K_xLuNb_{2-z}Ta_zO_7$, $Rb_xLuNb_{2-z}Ta_zO_7$, $Cs_xLuNb_{2-z}Ta_zO_7$, $H_xSrNb_{2-z}Ta_zO_7$, $Li_xSrNb_{2-z}Ta_zO_7$, $Na_xSrNb_{2-z}Ta_zO_7$, $K_xSrNb_{2-z}Ta_zO_7$, $Rb_xSrNb_{2-z}Ta_zO_7$, $Cs_xSrNb_{2-z}Ta_zO_7$, $H_xBaNb_{2-z}Ta_zO_7$, $Li_xBaNb_{2-z}Ta_zO_7$, $Na_xBaNb_{2-z}Ta_zO_7$, $K_xBaNb_{2-z}Ta_zO_7$, $Rb_xYbNb_{2-z}Ta_zO_7$, $Cs_xYbNb_{2-z}Ta_zO_7$, $H_xPbNb_{2-z}Ta_zO_7$, $Li_xPbNb_{2-z}Ta_zO_7$, $Na_xPbNb_{2-z}Ta_zO_7$, $K_xPbNb_{2-z}Ta_zO_7$, $Rb_xPbNb_{2-z}Ta_zO_7$, $Cs_xPbNb_{2-z}Ta_zO_7$, $H_xBiNb_{2-z}Ta_zO_7$, $Li_xBiNb_{2-z}Ta_zO_7$, $Na_xBiNb_{2-z}Ta_zO_7$, $K_xBiNb_{2-z}Ta_zO_7$, $Rb_xBiNb_{2-z}Ta_zO_7$, $Cs_xBiNb_{2-z}Ta_zO_7$, $HCa_2Nb_3O_{10}$, $LiCa_2Nb_3O_{10}$, $NaCa_2Nb_3O_{10}$, $KCa_2Nb_3O_{10}$, $RbCa_2Nb_3O_{10}$, $CsCa_2Nb_3O_{10}$, $Li_xK_{1-x}Ca_2Nb_3O_{10}$, $HSr_2Nb_3O_{10}$, $LiSr_2Nb_3O_{10}$, $NaSr_2Nb_3O_{10}$, $KSr_2Nb_3O_{10}$, $RbSr_2Nb_3O_{10}$, $CsSr_2Nb_3O_{10}$, $HBa_2Nb_3O_{10}$, $LiBa_2Nb_3O_{10}$, $NaBa_2Nb_3O_{10}$, $KBa_2Nb_3O_{10}$, $RbBa_2Nb_3O_{10}$, $CsBa_2Nb_3O_{10}$, $HPb_2Nb_3O_{10}$, $LiPb_2Nb_3O_{10}$, $NaPb_2Nb_3O_{10}$, $KPb_2Nb_3O_{10}$, $RbPb_2Nb_3O_{10}$, $CsPb_2Nb_3O_{10}$, $HCa_2Nb_{3-z}Ta_zO_{10}$, $LiCa_2Nb_{3-z}Ta_zO_{10}$, $NaCa_2Nb_{3-z}Ta_zO_{10}$, $KCa_2Nb_{3-z}Ta_zO_{10}$, $RbCa_2Nb_{3-z}Ta_zO_{10}$, $CsCa_2Nb_{3-z}Ta_zO_{10}$, $HSr_2Nb_{3-z}Ta_zO_{10}$, $LiSr_2Nb_{3-z}Ta_zO_{10}$, $NaSr_2Nb_{3-z}Ta_zO_{10}$, $KSr_2Nb_{3-z}Ta_zO_{10}$, $RbSr_2Nb_{3-z}Ta_zO_{10}$, $CsSr_2Nb_{3-z}Ta_zO_{10}$, $HBa_2Nb_{3-z}Ta_zO_{10}$, $LiBa_2Nb_{3-z}Ta_zO_{10}$, $NaBa_2Nb_{3-z}Ta_zO_{10}$, $KBa_2Nb_{3-z}Ta_zO_{10}$, $RbBa_2Nb_{3-z}Ta_zO_{10}$, $CsBa_2Nb_{3-z}Ta_zO_{10}$, $HPb_2Nb_{3-z}Ta_zO_{10}$, $LiPb_2Nb_{3-z}Ta_zO_{10}$, $NaPb_2Nb_{3-z}Ta_zO_{10}$, $KPb_2Nb_{3-z}Ta_zO_{10}$, $RbPb_2Nb_{3-z}Ta_zO_{10}$, $CsPb_2Nb_{3-z}Ta_zO_{10}$, $KLa_2Ti_2NbO_{10}$, $CsLa_2Ti_2NbO_{10}$, $HLa_2Ti_2NbO_{10}$, $HCaLaNb_2TiO_{10}$, $HLa_2Ti_2NbO_{10}$, $LiEu_2Ti_2NbO_{10}$, $NaEu_2Ti_2NbO_{10}$, $CsEu_2Ti_2NbO_{10}$, $KLaNb_2O_7$, $RbLaNb_2O_7$, $Rb_{2-x}LaNb_2O_7$, $NaLaSrNb_2MnO_9$, $KLaSrNb_2MnO_9$, $RbLaSrNb_2MnO_9$, $RbLaSrNb_2MgO_9$, $RbLaSrNb_2CuO_9$, $RbLaSrNb_2ZnO_9$, $CsLaSrNb_2CuO_9$, $HCa_2Ta_3O_{10}$, $LiCa_2Ta_3O_{10}$, $NaCa_2Ta_3O_{10}$, $KCa_2Ta_3O_{10}$, $RbCa_2Ta_3O_{10}$, $CSCa_2Ta_3O_{10}$, $HSr_2Ta_3O_{10}$, $LiSr_2Ta_3O_{10}$, $NaSr_2Ta_3O_{10}$, $KSr_2Ta_3O_{10}$, $RbSr_2Ta_3O_{10}$, $CsSr_2Ta_3O_{10}$, $HBa_2Ta_3O_{10}$, $LiBa_2Ta_3O_{10}$, $NaBa_2Ta_3O_{10}$, $KBa_2Ta_3O_{10}$, $RbBa_2Ta_3O_{10}$, $CsBa_2Ta_3O_{10}$, $HPb_2Ta_3O_{10}$, $LiPb_2Ta_3O_{10}$, $NaPb_2Ta_3O_{10}$, $KPb_2Ta_3O_{10}$, $RbPb_2Ta_3O_{10}$, $CsPb_2Ta_3O_{10}$, $CaNaTa_3O_9$, $Ca_2Ta_2TiO_9$, $SrLaTi_2TaO_9$, $LiLaTa_2O_7$, $H_2SrTa_2O_7$, $SrTa_2O_6$ ($0 \leq x \leq 1$; $0 < z \leq 3$).

The treatment for peeling may be referred to as soft chemical treatment.

Here the soft chemical treatment is a combined treatment of acid treatment and colloidization treatment. In other words, a powder or a single crystal of a layered structure-having perovskite oxide is brought into contact with an aqueous acid solution of hydrochloric acid or the like, and the product is filtered, washed and dried, whereupon all the alkali metal ions having existed between the layers before the treatment are replaced with hydrogen ion to give a hydride material. Next, the obtained hydride material is put into an aqueous solution of amine or the like and stirred therein for colloidization. In this stage, the layers having formed the layered structure are individually peeled each one nanosheet. The nanosheet thickness may be controlled within a range of sub-nm to nm.

From the thus-peeled perovskite nanosheets and according to the Langmuir-Blodgett method which the present inventors have already proposed (hereinafter this may be simply referred to as "LB method" and for its details, Non-Patent Document 1 is referred to), a ferroelectric thin film having a superlattice structure can be formed.

The LB method is a method known as a film formation method for clay minerals or organic nano-thin films, in which amphipathic molecules are used to form an associated film on a vapor-water interface, and this is transferred onto a substrate to form a uniform monolayer film. For perovskite nanosheets, when a perovskite nanosheet-sol solution having a low concentration is used, then the nanosheets are adsorbed by the vapor-water interface without using any amphipathic cationic molecules, and further the nanosheets adsorbed by the vapor-water interface are collected with a barrier thereby making it possible to produce a high-quality monolayer film in which the substrate surface is densely and tightly coated with the perovskite nanosheets.

The above-mentioned LB method is applied to at least two types of perovskite nanosheets, and the different types of perovskite nanosheets are alternately layered to provide a superlattice structure-having ferroelectric thin film.

Apart from the LB method, the same ferroelectric thin film having a superlattice structure of perovskite nanosheets can be formed according to an alternate self-organizing lamination technique (see Patent Document 1, Patent Document 2) which the present inventors have already proposed.

The actual operation includes a series of the following steps as one cycle:

1. immersing a substrate in an organic polycation solution,
2. washing the substrate with pure water,
3. immersing the substrate in a perovskite nanosheet-sol solution,
4. washing the substrate with pure water, and the necessary number of cycles is repeated for at least two types of perovskite nanosheets. As the organic polycation, suitably used here is polyethyleneimine (PEI) described in Examples, as well as polydiallyldimethylammonium chloride (PDDA), polyallylamine hydrochloride (PAH) or the like having the same cationic property. For alternate lamination, a positive charge may be introduced into the substrate surface with no substantial problem. Accordingly, in place of the organic polymer, a positively-charged inorganic polymer or a polynuclear hydroxide ion-containing inorganic compound may also be used.

Further, the invention provides a method for forming a perovskite nanosheet monolayer to be the constitutive layer of the ferroelectric thin film, which includes tightly coating the surface of the substrate with perovskite nanosheets to prevent or reduce mutual overlapping of perovskite nanosheets.

In order to tightly coat the substrate with perovskite nanosheets according to the method, the substrate is immersed in a cationic organic polymer solution to thereby make the organic polymer adsorbed by the substrate surface, and then immersed in a colloid solution of flaky particles of perovskite nanosheets suspended therein to make the nanosheets adsorbed by the substrate in a mode of self-organization through electrostatic interaction therebetween, thereby forming the monolayer. In addition, since the overlapping part of perovskite sheets is removed or reduced, the monolayer film can be formed through ultrasonic treatment in an aqueous alkali solution. The method makes it possible to produce a high-quality monolayer film of perovskite nanosheets densely and tightly coating the substrate surface on the same level as that according to the LB method.

The method is applied to at least two different types of perovskite nanosheets to thereby alternately laminate those different types of perovskite nanosheets to give the intended ferroelectric thin film having a superlattice structure.

Further, in the method, the organic polymer is removed through irradiation with UV light and therefore it is possible to form an inorganic ferroelectric thin film. The UV irradiation may be with at a wavelength not longer than the band gap at which the photocatalyst-assisted organic material decomposition of layered perovskite oxides is activated, and more preferably for the irradiation, a xenon light source of at least 1 mW/cm$^2$ may be used for 12 hours or more.

According to the method, there is provided a ferroelectric thin film having a superlattice structure in which the dielectric materials are electrostatically softly bonded to each other via a polyatomic ion.

The invention provides a production method for a ferroelectric ultrathin film or an element thereof, including the above-mentioned method as at least a part of the process.

For example, in the embodiment demonstrated in the following Examples, a layered perovskite oxide ($KCa_2Nb_3O_{10}$, $KLaNb_2O_7$) is used as the starting material to produce perovskite nanosheets ($Ca_2Nb_3O_{10}$, $LaNb_2O_7$); and as shown in FIG. 1, a ferroelectric thin film having a superlattice structure is formed on an atomically-flat epitaxial $SrRuO_3$ substrate according to an LB method or an alternate self-organizing lamination technique.

Needless-to-say, the invention is not restricted by the following Examples.

Example 1

In this Example, a layered perovskite oxide (for example, $KCa_2Nb_3O_{10}$, $KLaNb_2O_7$) was used as the starting material to produce perovskite nanosheets ($Ca_2Nb_3O_{10}$, $LaNb_2O_7$); and as shown in FIG. 1, a superlattice structure including the above-mentioned perovskite nanosheets (2) and (2') was formed on the lower electrode substrate, atomically-flat epitaxial $SrRuO_3$ substrate (1), according to the LB method in the manner mentioned below.

The first layered perovskite oxide $KCa_2Nb_3O_{10}$ was obtained by mixing potassium carbonate, calcium carbonate and niobium oxide in a ratio K/Ca/Nb of 1.1/2/3, and firing the mixture at 1473 K for 12 hours. The second layered perovskite oxide $KLaNb_2O_7$ was obtained by mixing potassium carbonate, lanthanum oxide and niobium oxide in a ratio K/La/Nb of 1.1/1/2, then prefiring the mixture at 1173 K for an hour, again mixing it and firing it at 1423 K for 24 hours. 5 g of each powder was acid-processed in 200 cm$^3$ of 5 N-nitric acid solution at room temperature to give first and second hydrogen-exchanged layered perovskite oxides $HCa_2Nb_3O_{10} \cdot 1.5H_2O$ and $HLaNb_2O_7 \cdot 0.25H_2O$. Next, 100 cm$^3$ of aqueous solution of tetrabutylammonium hydroxide (hereinafter referred to as TBAOH) was added to 0.4 g of each hydrogen-exchanged layered perovskite oxide, and then stirred and reacted at room temperature for 7 days to give two different types of milky-white sol solutions of rectangular nanosheets (2) and (2') dispersed therein, in which the two nanosheets were represented by a compositional formula $Ca_2Nb_3O_{10}$ or $LaNb_2O_7$, respectively, and had a thickness of about 1.5 nm or about 1.1 nm, a lateral size of from 100 nm to 2 μm, and a size of from 500 nm to 5 μm.

The conductive substrate (1) to be the lower electrode of atomically-flat epitaxial $SrRuO_3$ was surface-washed through UV irradiation in an ozone atmosphere.

In a 1 dm$^3$-measuring flask, 8 cm$^3$ of each perovskite nanosheet-sol solution was dispersed in ultrapure water. The resulting dispersion was left as such for a half day or one day or so, and then developed on an LB-trough well washed with acetone, and thereafter kept as such for 30 minutes so that the liquid level could be stabilized and the temperature of the bottom liquid could be constant. Subsequently, the substrate (1) prepared in the above was set in the LB film formation apparatus, and a series of the following steps, as one cycle, with each of the two types of the perovskite nanosheets were sequentially repeated for plural cycles so as to alternately laminate different types of perovskite nanosheets on the substrate, thereby producing a superlattice structure favorable for ferroelectric thin film. Needless-to-say, the final cycle may be discontinued on the way to thereby make the number of the layers of the two types of nanosheets differ from each other. The same shall apply to other Examples.

[1] The barrier is moved at a compression speed of 0.5 mm/min to compress the surface so as to collect one type of perovskite nanosheets dispersed on the vapor-water interface, and after the pressure has reached a predetermined level, this is left as such for 30 minutes. In that manner, a monolayer film of perovskite nanosheets integrated in parallel on the vapor-water interface is formed.

[2] The substrate (1) is vertically pulled up at a pulling speed of 0.8 mm/min so as to adhere the monolayer film to the substrate, thereby giving a thin film of one type of perovskite nanosheets densely packed therein.

The thin film having a superlattice structure thus obtained was UV-irradiated with a xenon light source (1 mW/cm$^2$, 72 hours), and by utilizing the photocatalyst reaction of the perovskite nanosheets, TBAOH used as the peeling agent was decomposed and removed from the thin film.

Figure 2:
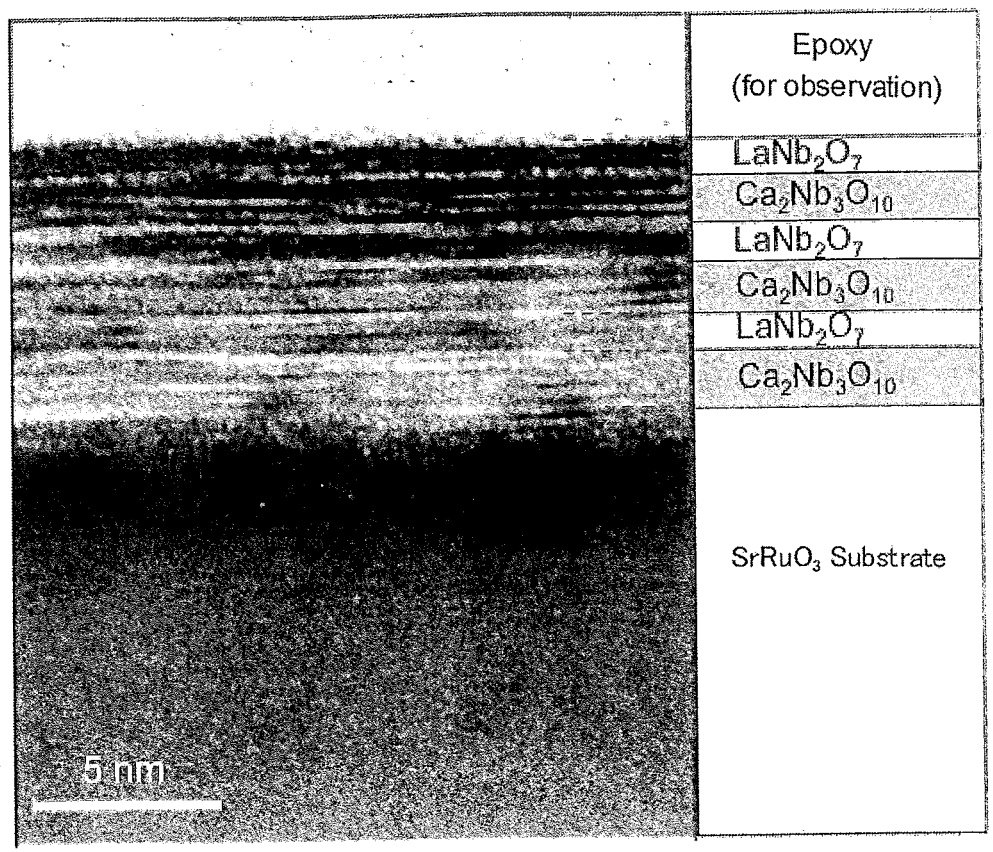
FIG. 2 is a high-resolution transmission electron micrograph of the cross section of a layered perovskite nanosheet thin film having three layers shown in Example 1.

FIG. 2 shows the result of evaluation of the cross-sectional structure of the thin film having a superlattice structure of alternate three layers of $Ca_2Nb_3O_{10}$ and $LaNb_2O_7$, through high-resolution transmission electron microscopy. A laminate structure of nanosheets cumulated in parallel on the atomic level on the substrate is confirmed, and the thickness of each layer was about 1.6 nm and about 1.2 nm, respectively. Three of those layers were alternately laminated to construct the superlattice structure. From this, it was confirmed that a high-quality superlattice film was realized in which the nanosheet monolayer films were alternately laminated with maintaining the tightness and the flatness thereof.

As a result of IR absorptiometry, it was confirmed that the ammonium ion ($NH_4^+$) formed through decomposition of TBAOH was coordinated between the layers of $Ca_2Nb_3O_{10}$ and $LaNb_2O_7$ to softly bond $Ca_2Nb_3O_{10}$ and $LaNb_2O_7$ to each other, thereby providing a structure facilitating easy movement of each constitutive atom. This demonstrates that this Example has "a superlattice structure in which the bonding interfaces of the dielectric materials are softly bonded to each other via an ionic material to make the ions easily move in the dielectric materials".

Another notable feature in FIG. 2 is that there exists neither a low-dielectric layer nor an interlayer to be formed as a result of substrate interface degradation or composition deviation owing to thermal annealing in the production process, which is often problematic in already-existing ferroelectric or high-dielectric thin films, between the lower electrode, substrate (1) and the perovskite nanosheet thin film. This is an epoch-making effect of the nanosheet thin film production step in this Example, in which is used a room-temperature solution process not influenced by substrate interface degradation or composition deviation.

Figure 3:
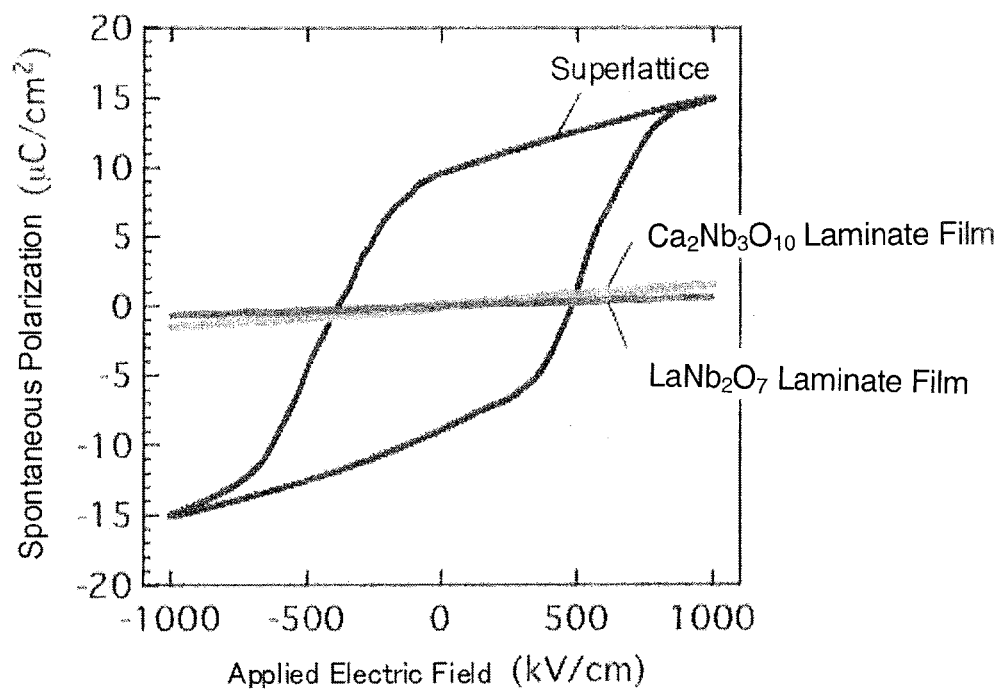
FIG. 3 is a graph showing a ferroelectric hysteresis characteristic of a superlattice-structured thin film of 5 layers of $Ca_2Nb_3O_{10}$ and $LaNb_2O_7$ alternately layered therein, shown in Example 1, and for comparison, a hysteresis characteristic of a multilayer film of 10 layers of $Ca_2Nb_3O_{10}$ or $LaNb_2O_7$ each layered alone.

FIG. 3 shows remnant polarization characteristic of a thin film element, or that is, a ferroelectric element produced in the manner as above, in which a gold dot electrode was formed as an upper electrode for the superlattice structure of alternately-laminated five layers of $Ca_2Nb_3O_{10}$ and $LaNb_2O_7$. For the remnant polarization characteristic, the remnant polarization value was measured during the time where the electric field applied at room temperature was varied from +1000 kV/cm to −1000 kV/cm, using Radiant Technology's ferroelectric test system (Precision Premier II). For comparison, FIG. 3 also shows the results of multilayer films of 10 layers of $Ca_2Nb_3O_{10}$ or $LaNb_2O_7$ alone.

As obvious from FIG. 3, only the superlattice structure of the multilayer film formed by alternately laminating 5 layers of $Ca_2Nb_3O_{10}$ and $LaNb_2O_7$ exhibited the hysteresis characteristic suggesting ferroelectricity at room temperature. On the other hand, the multilayer films of 10 layers of $Ca_2Nb_3O_{10}$ or $LaNb_2O_7$ alone could not exhibit the hysteresis characteristics that the superlattice structure exhibited.

Table 1 collectively shows the remnant polarization value and the relative dielectric constant of superlattice structure-having thin film elements where 3 layers, 5 layers or 10 layers of $Ca_2Nb_3O_{10}$ and $LaNb_2O_7$ were alternately laminated. For the relative dielectric constant, the electrostatic capacitance of each element was measured with Agilent Technology's high-precision LCR meter (4284A) at a frequency of 10 kHz, from which the relative dielectric constant thereof was derived.

TABLE 1

| Composition | Number of Alternate Lamination of Layers n | Thickness | Remnant Polarization Value | Relative Dielectric Constant |
|---|---|---|---|---|
| $(Ca_2Nb_3O_{10}/LaNb_2O_7)_n$ | 3 | 8.4 nm | 9 $\mu C/cm^2$ | 110 |
| $(Ca_2Nb_3O_{10}/LaNb_2O_7)_n$ | 5 | 14 nm | 10 $\mu C/cm^2$ | 115 |
| $(Ca_2Nb_3O_{10}/LaNb_2O_7)_n$ | 10 | 28 nm | 12 $\mu C/cm^2$ | 114 |

As in Table 1, the remnant polarization value of the ferroelectric thin films having a superlattice structure formed through alternate lamination of $Ca_2Nb_3O_{10}$ and $LaNb_2O_7$ was 9, 11 and 12 $\mu C/cm^2$, respectively, or that is, though extremely thin and having a thickness of 8.4, 14 or 28 nm, respectively, the films all exhibited a stable ferroelectric hysteresis characteristic at room temperature. The relative dielectric constant of the ferroelectric thin films having the superlattice structure was more than 100 and was high, irrespective of the number of the laminated layers. As in the above, ferroelectric thin films realizing both stable ferroelectric characteristics and high dielectric characteristics at room temperature can be produced even though each layer constituting the films has a nano-scale thickness of less than 50 nm.

Example 2

In this Example, first and second perovskite oxides $KCa_2Nb_3O_{10}$ and $KLaNb_2O_7$ were used as the starting materials to produce first and second perovskite nanosheets of $Ca_2Nb_3O_{10}$ and $LaNb_2O_7$, respectively; and as shown in FIG. 1, a superlattice structure including these two types of perovskite nanosheets (2) and (2') were formed on the lower electrode substrate, atomically-flat epitaxial $SrRuO_3$ substrate (1), according to alternate self-organization film formation technology in the manner mentioned below.

According to the same method as in Example 1, the first and second layered perovskite oxides $KCa_2Nb_3O_{10}$ and $KLaNb_2O_7$ were peeled into monolayers to give milky-white sol solutions of rectangular nanosheets (2) and (2') dispersed therein, in which the two nanosheets were represented by a compositional formula $Ca_2Nb_3O_{10}$ or $LaNb_2O_7$, respectively, and had a thickness of about 1.5 nm or about 1.1 nm, a lateral size of from 100 nm to 2 $\mu m$, and a size of from 500 nm to 5 $\mu m$.

The conductive substrate (1) to be the lower electrode of atomically-flat epitaxial $SrRuO_3$ was surface-washed through UV irradiation in an ozone atmosphere, and then the substrate was immersed in a solution of hydrochloric acid/methanol=1/1 for 20 minutes and thereafter in concentrated sulfuric acid solution for 20 minutes for hydrophilization.

The substrate (1) was sequentially processed according to the following series of steps, as one cycle, for each of the two types of nanosheets (2) and (2'), and the cycles were repeated for the necessary times to thereby produce a thin film having a desired superlattice structure. For example, the structure of FIG. 1 is a result of repetition of three such cycles.

[1] The substrate is immersed in a PEI solution as the above-mentioned polycation solution, for 20 minutes.
[2] The substrate is fully washed with Milli-Q pure water.
[3] The substrate is immersed in one of the above-mentioned nanosheet sol solution kept stirred.
[4] After 20 minutes, the substrate is fully washed with Milli-Q pure water.
[5] The obtained thin film was, while immersed in an aqueous TBAOH solution at pH of 11, ultrasonicated for 20 minutes by the use of an ultrasonic washing tank (by Branson, 42 kHz, 90 W).

Thus obtained, the superlattice structure-having thin film was UV-irradiated with a xenon light source (1 $mW/cm^2$, 72 hours), and by utilizing the photocatalyst reaction of the perovskite nanosheets, the organic polymer was decomposed and removed from the thin film.

As a result of IR absorptiometry, it was confirmed that the ammonium ion ($NH_4^+$) formed through decomposition of the organic polymer was coordinated between the layers of $Ca_2Nb_3O_{10}$ and $LaNb_2O_7$ to softly bond $Ca_2Nb_3O_{10}$ and $LaNb_2O_7$ to each other, thereby providing a structure facilitating easy movement of each constitutive atom. This demonstrates that this Example also has "a superlattice structure in which the bonding interfaces of the dielectric materials are softly bonded to each other via an ionic material to make the ions easily move in the dielectric materials".

Thus produced, the superlattice structure-having thin film elements where 3 layers or 5 layers of $Ca_2Nb_3O_{10}$ and $LaNb_2O_7$ were alternately laminated, or that is the ferroelectric elements were analyzed and evaluated for the remnant polarization value and the relative dielectric constant thereof according to the same process and under the same measurement condition as in Example 1, and the same results as in Table 1 were also obtained here. Specifically, in this Example 2, the elements were produced according to the method differing from that in Example 1; however, all these elements have the common structure of "a superlattice structure in which the bonding interfaces of the dielectric materials are softly bonded to each other via an ionic material to make the ions easily move in the dielectric materials", and attain the above-mentioned effects and advantages common to them. This fact reinforces the reasonableness of the model of the invention that the common structure brings about the common effects and advantages.

Example 3

In this Example, first and second layered perovskite oxides $KCa_2Nb_3O_{10}$ and $KSr_2Nb_3O_{10}$ were used as the starting material to produce first and second perovskite nanosheets $Ca_2Nb_3O_{10}$ and $Sr_2Nb_3O_{10}$, respectively; and as shown in FIG. 1, a superlattice structure including the perovskite nanosheets (2) and (2') was formed on the lower electrode substrate, atomically-flat epitaxial $SrRuO_3$ substrate (1), according to the LB method in the manner mentioned below.

The first and second layered perovskite oxides $KCa_2Nb_3O_{10}$ and $KSr_2Nb_3O_{10}$ were obtained by mixing potassium carbonate, calcium carbonate (or strontium carbonate) and niobium oxide in a ratio K/Ca(Sr)/Nb of 1.1/2/3, and firing the mixture at 1473 K for 12 hours. 5 g of each powder was acid-processed in 200 $cm^3$ of 5 N-nitric acid solution at room temperature to give first and second hydrogen-exchanged layered perovskite oxides. Next, 100 $cm^3$ of aqueous solution of tetrabutylammonium hydroxide (hereinafter referred to as TBAOH) was added to 0.4 g of each hydrogen-exchanged layered perovskite oxide, and then stirred and reacted at room temperature for 7 days to give milky-white, first and second sol solutions of rectangular nanosheets (2) and (2') dispersed therein, in which the two nanosheets were represented by a compositional formula $Ca_2Nb_3O_{10}$ or $Sr_2Nb_3O_{10}$, respectively, and had a thickness of 1.5 nm and a lateral size of from 500 nm to 5 μm.

The conductive substrate (1) to be the lower electrode of atomically-flat epitaxial $SrRuO_3$ was surface-washed through UV irradiation in an ozone atmosphere.

Two 1 $dm^3$-measuring flasks were prepared for the first and second sol solutions. 8 $cm^3$ of each perovskite nanosheet-sol solution was dispersed in ultrapure water. The resulting dispersion was left as such for a half day or one day or so, and then developed on an LB-trough well washed with acetone, and thereafter kept as such for 30 minutes so that the liquid level could be stabilized and the temperature of the bottom liquid could be constant. Subsequently, the substrate (1) prepared in the above was set in the LB film formation apparatus, and a series of the following steps, as one cycle, with each of the different types of the perovskite nanosheets were sequentially repeated for plural cycles so as to alternately laminate different types of perovskite nanosheets on the substrate, thereby producing a superlattice structure favorable for ferroelectric thin film.

[1] The barrier is moved at a compression speed of 0.5 mm/min to compress the surface so as to collect one type of perovskite nanosheets dispersed on the vapor-water interface, and after the pressure has reached a predetermined level, this is left as such for 30 minutes. In that manner, a monolayer film of perovskite nanosheets integrated in parallel on the vapor-water interface is formed.

[2] The substrate (1) is vertically pulled up at a pulling speed of 0.8 mm/min so as to adhere the monolayer film to the substrate, thereby giving a thin film of one type of perovskite nanosheets densely packed therein.

The thin film having a superlattice structure thus obtained was UV-irradiated with a xenon light source (1 $mW/cm^2$, 72 hours), and by utilizing the photocatalyst reaction of the perovskite nanosheets, TBAOH used as the peeling agent was decomposed and removed from the thin film.

As a result of IR absorptiometry, it was confirmed that the ammonium ion ($NH_4^+$) formed through decomposition of TBAOH was coordinated between the layers of $Ca_2Nb_3O_{10}$ and $Sr_2Nb_3O_{10}$ to softly bond $Ca_2Nb_3O_{10}$ and $Sr_2Nb_3O_{10}$ to each other, thereby providing a structure facilitating easy movement of each constitutive atom. According to this, it is known that the "superlattice structure in which the bonding interfaces of the dielectric materials are softly bonded to each other via an ionic material to make the ions easily move in the dielectric materials" of the invention is realized here.

Table 2 summarizes the remnant polarization value and the relative dielectric constant of the thus-produced, superlattice structure-having thin film elements where 3 layers or 5 layers of $Ca_2Nb_3O_{10}$ and $Sr_2Nb_3O_{10}$ were alternately laminated. For the remnant polarization characteristic, the remnant polarization value was measured during the time where the electric field applied at room temperature was varied from +1000 kV/cm to −1000 kV/cm, using Radiant Technology's ferroelectric test system (Precision Premier II). For the relative dielectric constant, the electrostatic capacitance was measured with Agilent Technology's high-precision LCR meter (4284A) at a frequency of 10 kHz, from which the relative dielectric constant was derived.

TABLE 2

| Composition | Number of Alternate Lamination of Layers n | Thickness | Remnant Polarization Value | Relative Dielectric Constant |
|---|---|---|---|---|
| $(Ca_2Nb_3O_{10}/Sr_2Nb_3O_{10})_n$ | 3 | 9.6 nm | 10 $\mu C/cm^2$ | 230 |
| $(Ca_2Nb_3O_{10}/Sr_2Nb_3O_{10})_n$ | 5 | 16 nm | 7 $\mu C/cm^2$ | 225 |

As in Table 2, the remnant polarization value of the ferroelectric thin films having a superlattice structure formed through alternate lamination of $Ca_2Nb_3O_{10}$ and $Sr_2Nb_3O_{10}$ was 10 and 7 $\mu C/cm^2$, respectively, or that is, though extremely thin and having a thickness of 9.6 or 16 nm, respectively, the films all exhibited a stable ferroelectric hysteresis characteristic at room temperature. The relative dielectric constant of the ferroelectric thin films having the superlattice structure was more than 200 and was high, irrespective of the number of the laminated layers. As in the above, ferroelectric thin films realizing both stable ferroelectric characteristics and high dielectric characteristics at room temperature can be produced even though each layer constituting the films has a nano-scale thickness of less than 50 nm. In this Example 3, in addition, the combination of non-dielectric nanosheets differing from that in Examples 1 and 2 realized ferroelectric characteristics, and this Example confirms the reasonableness of the model of the invention.

Example 4

In this Example, three types of layered perovskite oxides $KLaNb_2O_7$, $KCa_2Nb_3O_{10}$ and $KSr_2Nb_3O_{10}$ were used as the starting material to produce three types of perovskite nanosheets $LaNb_2O_7$, $Ca_2Nb_3O_{10}$, $Sr_2Nb_3O_{10}$, respectively; and as shown in FIG. 1, a superlattice structure including the perovskite nanosheets (2), (2') and (2") was formed on the lower electrode substrate, atomically-flat epitaxial $SrRuO_3$ substrate (1), according to the LB method in the manner mentioned below.

The perovskite nanosheets (2), (2') and (2") were produced from the starting material of the layered perovskite oxides $KLaNb_2O_7$, $KCa_2Nb_3O_{10}$ and $KSr_2Nb_3O_{10}$, according to the same method as in Examples 1 to 3 mentioned above.

The conductive substrate (1) to be used as the lower electrode of atomically-flat epitaxial $SrRuO_3$ was surface-washed through UV irradiation in an ozone atmosphere.

In three 1 $dm^3$-measuring flasks, 8 $cm^3$ of each perovskite nanosheet-sol solution was dispersed in ultrapure water. The resulting dispersion was left as such for a half day or one day or so, and then developed on an LB-trough well washed with acetone, and thereafter kept as such for 30 minutes so that the liquid level could be stabilized and the temperature of the bottom liquid could be constant. Subsequently, the substrate (1) prepared in the above was set in the LB film formation apparatus, and a series of the following steps, as one cycle, with each of the three types of the perovskite nanosheets were sequentially repeated for plural cycles so as to alternately laminate different types of perovskite nanosheets on the substrate, thereby producing a superlattice structure favorable for ferroelectric thin film.

[1] The barrier is moved at a compression speed of 0.5 mm/min to compress the surface so as to collect the perovskite nanosheets dispersed on the vapor-water interface, and after the pressure has reached a predetermined level, this is left as such for 30 minutes. In that manner, a monolayer film of perovskite nanosheets integrated in parallel on the vapor-water interface is formed.

[2] The substrate (1) is vertically pulled up at a pulling speed of 0.8 mm/min so as to adhere the monolayer film to the substrate, thereby giving a thin film of perovskite nanosheets densely packed therein.

The thin film having a superlattice structure thus obtained was UV-irradiated with a xenon light source (1 mW/cm$^2$, 72 hours), and by utilizing the photocatalyst reaction of the perovskite nanosheets, TBAOH used as the peeling agent was decomposed and removed from the thin film.

As a result of IR absorptiometry, it was confirmed that the ammonium ion ($NH_4^+$) formed through decomposition of TBAOH was coordinated between the layers of $LaNb_2O_7$, $Ca_2Nb_3O_{10}$ and $Sr_2Nb_3O_{10}$ to softly bond the dielectric materials to each other, thereby providing a structure facilitating easy movement of each constitutive atom. This also demonstrates that the "superlattice structure in which the bonding interfaces of the dielectric materials are softly bonded to each other via an ionic material to make the ions easily move in the dielectric materials" of the invention is realized here.

Table 3 summarizes the remnant polarization value and the relative dielectric constant of the thus-produced, superlattice structure-having thin film element (ferroelectric element) where (2) $LaNb_2O_7$, (2') $Ca_2Nb_3O_{10}$ and (2") $Sr_2Nb_3O_{10}$ were laminated through lamination of (2)→(2')→(2") repeated for a total of three times in that order. For the remnant polarization characteristic, the remnant polarization value was measured during the time where the electric field applied at room temperature was varied from +1000 kV/cm to −1000 kV/cm, using Radiant Technology's ferroelectric test system (Precision Premier II). For the relative dielectric constant, the electrostatic capacitance was measured with Agilent Technology's high-precision LCR meter (4284A) at a frequency of 10 kHz, from which the relative dielectric constant was derived.

TABLE 3

| Composition | Number of Alternate Lamination of Layers n | Thickness | Remnant Polarization Value | Relative Dielectric Constant |
|---|---|---|---|---|
| $(LaNb_2O_7/Ca_2Nb_3O_{10}/Sr_2Nb_3O_{10})_n$ | 2 | 8.8 nm | 10 µC/cm$^2$ | 120 |

As in Table 3, the remnant polarization value of the ferroelectric thin film having a superlattice structure formed through alternate lamination of $LaNb_2O_7$, $Ca_2Nb_3O_{10}$ and $Sr_2Nb_3O_{10}$ was 10 µC/cm$^2$, or that is, though extremely thin and having a thickness of 8.8 nm, the film exhibited a stable ferroelectric hysteresis characteristic at room temperature. The relative dielectric constant of the ferroelectric thin film having the superlattice structure was 120 and was high, irrespective of the number of the laminated layers. As in the above, a ferroelectric thin film realizing both stable ferroelectric characteristics and high dielectric characteristics at room temperature can be produced even though each layer constituting the film has a nano-scale thickness of less than 50 nm. In this Example 4, in addition, the combination of three different types of dielectric nanosheets differing from that in Examples 1 to 3 realized ferroelectric characteristics. This confirms that the model of the invention is realized even in a case where the types of the dielectric nanosheets therein are more than two.

As demonstrated in Examples 1 to 4, the thin films including a superlattice structure of the invention make it possible to convert even materials which have heretofore been useless as ferroelectric materials, into ferroelectric materials depending on the combination thereof. Accordingly, the application range of dielectric materials and the latitude in selecting ferroelectric materials are thereby significantly enlarged.

According to the invention, the bonding interfaces of dielectric materials can be softly bonded to each other via an ionic material to form a superlattice structure in which the ions inside the dielectric material can easily move, and consequently, dielectric materials can be thereby converted into ferroelectric materials. In the above-mentioned Examples of the invention, two or more different types of dielectric perovskite nanosheets formed a superlattice structure, thereby demonstrating the effect of the invention. However, the same structure in which molecules are arranged between different types of materials can be formed with any other perovskite-structured oxides, and the structure of the type also expresses the same ferroelectric effect.

In the Examples, ammonium ion ($NH^{4+}$) was used as the ionic material to softly bond the bonding interfaces of dielectric materials; however, the same structure can also be formed with any other ionic material such as a metal ion, a polyatomic ion, a complex ion, a cluster ion or the like, and the structure of the type also expresses the same ferroelectric effect.

The ferroelectric thin film of the invention exhibits stable ferroelectric characteristics and high dielectric characteristics having a high relative dielectric constant of at least 100, in a 10-nm level thin film region. Accordingly, the invention realizes both stable ferroelectric characteristics and high dielectric permittivity even in a nano-region, and provides an epoch-making effect of realizing ferroelectric characteristics with no size effect.

In forming multilayer films, ferroelectric thin films may be adhered additionally to the upper electrode substrate according to the process of the above-mentioned Examples 1 to 4, and combining both the two for forming multilayer films is also within the scope of the invention.

Applying the ferroelectric thin film produced in the manner as above to nonvolatile ferroelectric memories and others enables reduction in the film thickness to a 10 nm-level, which, however, has heretofore been impossible with already-existing ferroelectric thin films, and accordingly, it has become possible to provide small-sized, low-power-consumption memory devices capable of being operated at low voltage as one characteristic feature of ultrathin films. Further, in high-level integration of memories and transistors, for example, the invention provides an excellent effect of free planning to give various types of models such as trench-type or stack-type models.

As in the above, the invention has been described with reference to some embodiments where a superlattice structure-having ferroelectric thin film is formed on an atomically-flat epitaxial $SrRuO_3$ substrate and applied to a nonvolatile ferroelectric memory; however, the ferroelectric thin film of the invention can also be used as a thin film capacitor by itself, and when used in gate insulators for transistors, laminate capacitors for portable telephones, high-frequency devices, actuators and others, the ferroelectric thin film of the invention exhibits the same excellent effect as herein.

The perovskite nanosheets used in Examples of the invention can be used in producing elements by utilizing the soft chemical reaction of self-organization at room temperature thereof, and accordingly, those perovskite nanosheets can evade various problems of substrate interface degradation, composition deviation or the like to occur in thermal annealing in a conventional semiconductor production process, and can be fused with various types of materials.

Further, the invention can realize a low-cost low-environmental-load process not requiring any large-scale vacuum apparatus and expensive film formation apparatus that are the mainstream of a conventional semiconductor process or dielectric thin film process.

Further, the ferroelectric thin film of the invention is an ecological material not containing any toxic element such as lead or the like, and is therefore expected to play an important role as an ecological material that contributes toward global environment protection.

As above, the ferroelectric thin film of the invention is extremely useful in various technical fields of electronic materials of non-volatile ferroelectric memories in which a ferroelectric thin film is the backbone part, gate insulators for transistors, laminate capacitors for portable telephones, high-frequency devices, actuators and the like, and also in IT technical field, nanoelectronics field, etc.

INDUSTRIAL APPLICABILITY

Ferroelectric thin films are used in various electronic instruments such as non-volatile memories, gate insulators for transistors, laminate capacitors for portable telephones, high-frequency devices, actuators and others. In particular, nonvolatile memories using a ferroelectric thin film are expected as ultimate memories capable of realizing high-speed operation, large capacity and non-volatility in place of DRAM that is now the mainstream of memories for personal computers, and the world's industry, government and academia fight desperately for studies and developments of such non-volatile memories.

In consideration of the above-mentioned points and further taking the other advantages of the invention into consideration that (1) the invention can convert a non-ferroelectric material into a ferroelectric material, (2) the ferroelectric thin film of the invention can function as one having the smallest thickness of all conventional ferroelectric thin films, and can realize both ferroelectric characteristics stable at room temperature and high permittivity of at least 100, (3) the ferroelectric thin film of the invention is an ecological material not containing any toxic element such as lead or the like, (4) the invention realized a room-temperature process and completely solved all the problems associated with conventional thermal annealing, and (5) the invention realized a low-cost low-environmental-load process not requiring any large-scale vacuum apparatus and expensive film formation apparatus that are the mainstream of a conventional semiconductor process or dielectric thin film process, the economic advantages of the invention are obvious.

DESCRIPTION OF REFERENCE NUMERALS

1 lower electrode substrate
2, 2', 2" nanosheet
3 upper electrode

The invention claimed is:

1. A ferroelectric thin film having a superlattice structure and produced by alternatingly layering at least two different types of dielectric materials, in which the different dielectric materials are bonded with an ionic material, wherein each of the at least two different types of dielectric materials is an oxide having a nanosheet-like perovskite structure.

2. The ferroelectric thin film having a superlattice structure according to claim 1, wherein each of the at least two dielectric materials has at least one of an $NbO_6$ octahedron, a $TaO_6$ octahedron and a $TiO_6$ octahedron enveloped in the unit lattice thereof.

3. The ferroelectric thin film having a superlattice structure according to claim 1, wherein each of the at least two dielectric materials has a thickness of at most 5 nm and a lateral size of from 100 nm to 100 μm.

4. The ferroelectric thin film having a superlattice structure according to claim 1, wherein each of the at least two dielectric materials is one obtained by peeling any of layered oxides represented by the following compositional formulae, or their hydrates:

Compositional formula $A_xM_yNb_2O_{7-d}$, $A_xM_yM'_2O_{7-d}$, $A_xCa_2Nb_3O_{10-d}$, $A_xCa_{2-y}M_yNb_{3-z}M'_zO_{10-d}$, $A_xM_2M'_3O_{10-d}$ or $A_x[Ca_{n-1}Na_{n-3}Nb_nO_{3n+1-d}]$ (wherein A represents at least one selected from a group of H, Li, Na, K, Rb and Cs; 0≤x≤1; M represents at least one selected from a group of Sr, Ba, Pb, Bi, and rare earth elements La, Ce, Pr, Sm, Eu, Gd, Tb, Dy, Ho, Er, Tm, Yb and Lu; 0<y≤1; M' represents at least one selected from a group of Ti, Mg, Mn, Cu, Zn, Nb and Ta; 0<z≤3; n=3 to 8; d=0 to 2).

5. The ferroelectric thin film having a superlattice structure according to claim 1, wherein each of the at least two dielectric materials is a nanosheet-like perovskite oxide represented by the following compositional formula:

Compositional formula $M_yNb_2O_{7-d}$, $M_yM'_2O_{7-d}$, $Ca_2Nb_3O_{10-d}$, $Ca_{2-y}M_yNb_{3-z}M'_zO_{10-d}$, $M_2M'_3O_{10-d}$ or $[Ca_{n-1}Na_{n-3}Nb_nO_{3n+1-d}]$ (wherein M represents at least one selected from a group of Sr, Ba, Pb, Bi and rare earth elements La, Ce, Pr, Sm, Eu, Gd, Tb, Dy, Ho, Er, Tm, Yb and Lu; 0<y≤1; M' represents at least one selected from a group of Ti, Mg, Mn, Cu, Zn, Nb and Ta 0<z≤3; n=3 to 8; d=0 to 2).

6. The ferroelectric thin film having a superlattice structure according to claim 1, of which the thickness is from 1 nm to 50 nm.

7. A ferroelectric element comprising the with any of ferroelectric thin film of claim 1 adhering to an electrode substrate.

8. A method for producing a ferroelectric element, which comprises adhering any of the ferroelectric thin films of claim 1 onto a first electrode substrate and arranging a second electrode on the side of the ferroelectric thin film opposite to the side thereof having the first electrode substrate adhering thereto.

9. The method for producing a ferroelectric element according to claim 8, wherein the ferroelectric thin film having a superlattice structure is produced by repeating a step of densely and tightly coating the surface of the first electrode substrate with the dielectric material according to a Langmuir-Blodgett method to form a monolayer film on the surface, thereby adhering the monolayer film to the first electrode substrate.

10. The method for producing a ferroelectric element according to claim 8, wherein the ferroelectric thin film is produced by immersing the first electrode substrate in a cationic organic polymer solution to thereby make the organic polymer adsorbed by the surface of the first electrode substrate or by the surface of the dielectric material already adsorbed by the first electrode substrate, and then further immersing it in a colloid solution with the dielectric material suspended therein so as to make the dielectric material adsorbed by the surface of the dielectric material through electrostatic interaction therebetween, thereby producing the ferroelectric thin film having a superlattice structure.

11. The method for producing a ferroelectric element according to claim 10, wherein in the step of making the dielectric material adsorbed by the first substrate through electrostatic interaction therebetween, ultrasonic wave is imparted to the system to thereby remove the overlapping part of the dielectric materials.

12. The method for producing a ferroelectric element according to claim 10, wherein the ferroelectric thin film having a superlattice structure is, after formed, irradiated with UV light to remove the organic polymer.

13. The method for producing a ferroelectric element according to claim 12, wherein the ionic material is formed from the organic polymer through irradiation with UV light.

14. The method for producing a ferroelectric element according to claim 8, wherein the ferroelectric thin film is formed by peeling the layered material with a peeling agent, and after formed, the ferroelectric thin film is irradiated with UV light to remove the peeling agent, and the ionic material is formed from the peeling agent through irradiation with UV light.

\* \* \* \* \*